United States Patent
Suzuki et al.

(10) Patent No.: US 7,489,581 B2
(45) Date of Patent: Feb. 10, 2009

(54) SEMICONDUCTOR MEMORY (75) Inventors: Toshikazu Suzuki, Osaka (JP); Satoshi Ishikura, Osaka (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 11/889,140

(22) Filed: Aug. 9, 2007

(65) Prior Publication Data
US 2008/0037337 A1 Feb. 14, 2008

(30) Foreign Application Priority Data
Aug. 11, 2006 (JP) ............................. 2006-219589
Jul. 31, 2007 (JP) ............................. 2007-199707

(51) Int. Cl.
*G11C 5/14* (2006.01)
(52) U.S. Cl. .................... 365/226; 365/228; 365/63; 365/189.16; 365/189.09
(58) Field of Classification Search ................ 365/226, 365/228, 63, 189.16, 189.09
See application file for complete search history.

(56) References Cited

U.S. PATENT DOCUMENTS

| 4,310,900 | A | | 1/1982 | Tsujide |
| 4,685,085 | A | | 8/1987 | Spence |
| 5,079,744 | A | * | 1/1992 | Tobita et al. ................ 365/201 |
| 5,646,885 | A | * | 7/1997 | Matsuo et al. ......... 365/185.05 |
| 5,757,694 | A | | 5/1998 | Mitani |
| 5,812,445 | A | * | 9/1998 | Yamauchi ................... 365/154 |
| 6,316,812 | B1 | * | 11/2001 | Nagaoka ..................... 257/369 |
| 6,903,962 | B2 | * | 6/2005 | Nii .............................. 365/156 |
| 7,136,297 | B2 | * | 11/2006 | Tsujimura et al. ........... 365/154 |
| 2006/0098475 | A1 | | 5/2006 | Ohtake et al. |
| 2007/0002617 | A1 | | 1/2007 | Houston et al. |
| 2007/0081407 | A1 | | 4/2007 | Maki et al. |

FOREIGN PATENT DOCUMENTS

| JP | 55-64686 | 5/1980 |
| JP | 2007-109300 A | 4/2007 |

* cited by examiner

*Primary Examiner*—Viet Q Nguyen
(74) *Attorney, Agent, or Firm*—McDermott Will & Emery LLP (57) ABSTRACT

A semiconductor memory includes a plurality of memory cells, each of which includes a first inverter connected to one of high-data retaining supply lines which constitute one of high-data retaining supply line pairs corresponding to the memory cell and a second inverter connected to the other one of the high-data retaining supply lines which constitute the corresponding high-data retaining supply line pair, an input and output of the second inverter being connected to an output and input of the first inverter, respectively. A selected high-data retaining supply circuit receives a signal determined according to an input data signal and address signal without the intervention of any of the bit lines which constitute the bit line pairs to drive the connected high-data retaining supply lines such that it has a potential corresponding to the received signal.

7 Claims, 7 Drawing Sheets

SEMICONDUCTOR MEMORY

CROSS-REFERENCE TO RELATED APPLICATIONS

This application claims priority under 35 U.S.C. §119(a) on Japanese Patent Application No. 2006-219589 filed on Aug. 11, 2006 and Japanese Patent Application No. 2007-199707 filed on Jul. 31, 2007, the entire contents of which are hereby incorporated by reference.

BACKGROUND OF THE INVENTION

The present invention relates to a semiconductor memory which has a flip-flop type memory cell and specifically to control of a supply potential which is to be supplied to a memory cell.

In recent years, progress of semiconductor processes has been enhancing finer circuitry and, hence, rapid advance in achieving reduced circuit area of semiconductor integrated circuits and lower supply voltages. For example, in a semiconductor memory which has flip-flop type memory cells, such as static random access memory (SRAM), it has become very difficult for the memory cells to have stable characteristics due to variations in characteristics of transistors constituting the memory cells or decrease of supply voltage. Accordingly, the yield of semiconductor memories disadvantageously decreases due to reduction in static noise margin (SNM) or write margin.

As for the semiconductor memory having such flip-flop type memory cells, a technique of controlling the potential of a high-data retaining supply of the memory cells to achieve easier writing has been proposed. For example, the following conventional techniques have been known. Japanese Laid-Open Patent Publication No. 55-64686 proposes a semiconductor memory wherein the potential of the high-data retaining supply is controlled to be low during a write operation to render the write operation easier. Japanese Laid-Open Patent Publication No. 2007-109300 proposes a semiconductor memory having memory cells each of which includes two inverters wherein the potentials of two high-data retaining supplies each of which is determined according to the level of a bit line connected to the output of a corresponding one of the inverters are applied to the inverters, whereby easier writing is achieved.

Figure 6:
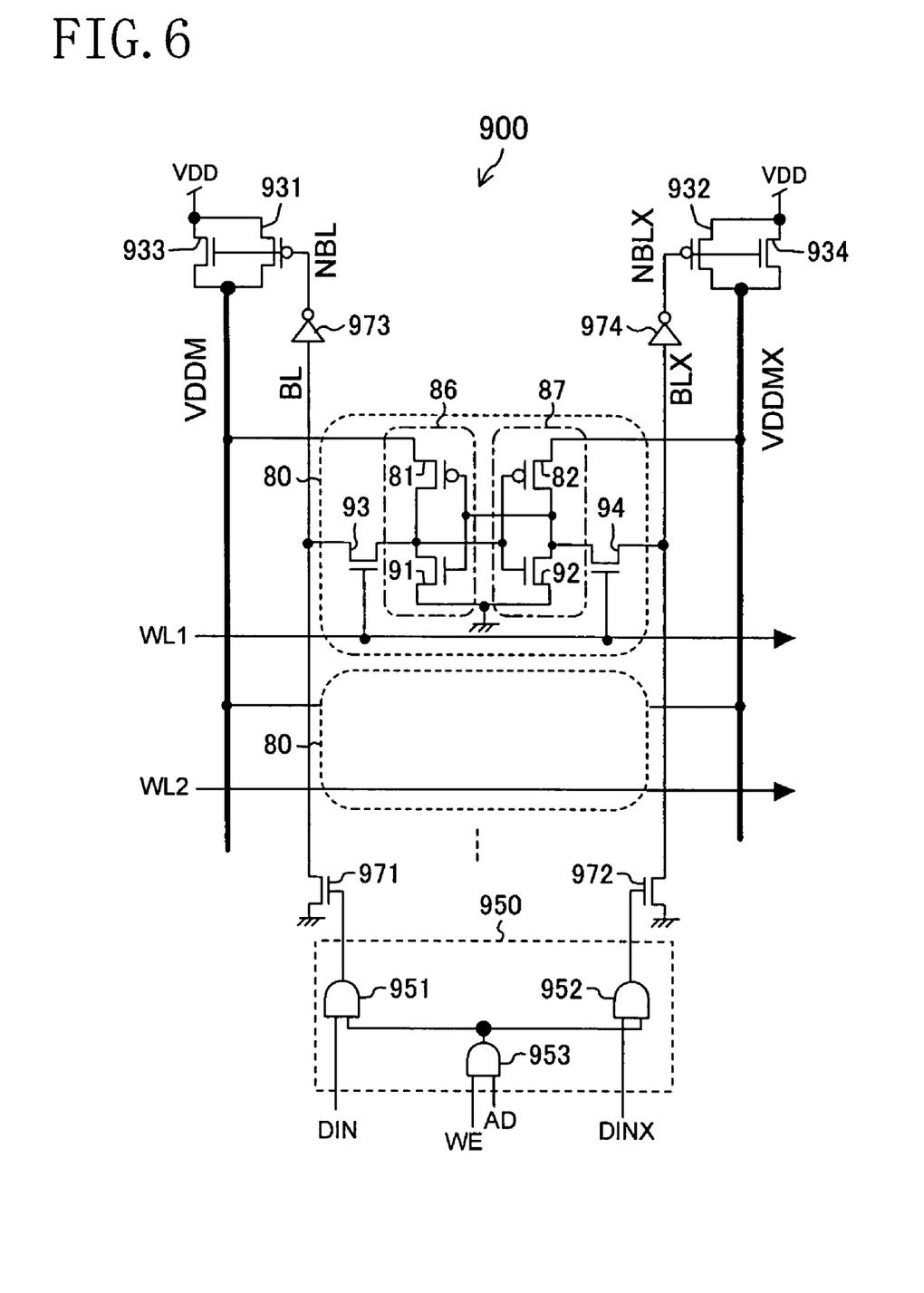
FIG. 6 is a circuit diagram showing an example of a structure of a conventional semiconductor memory.

FIG. 6 is a circuit diagram showing an example of a structure of a conventional semiconductor memory. The semiconductor memory 900 of FIG. 6 includes a plurality of memory cells 80, word lines WL1 and WL2, first and second bit lines BL and BLX, first and second high-data retaining supply lines VDDM and VDDMX, PMOS (p-channel metal oxide semiconductor) transistors 931 and 932, NMOS (n-channel metal oxide semiconductor) transistors 933, 934, 971 and 972, a selection circuit 950, and inverters 973 and 974. The selection circuit 950 includes AND circuits 951, 952 and 953.

Each of the memory cells 80 includes inverters 86 and 87 and access transistors 93 and 94. The inverter 86 includes a load transistor 81 and a drive transistor 91. The inverter 87 includes a load transistor 82 and a drive transistor 92. The inputs and outputs of the inverters 86 and 87 are cross-coupled with each other to constitute a flip-flop.

Figure 7:
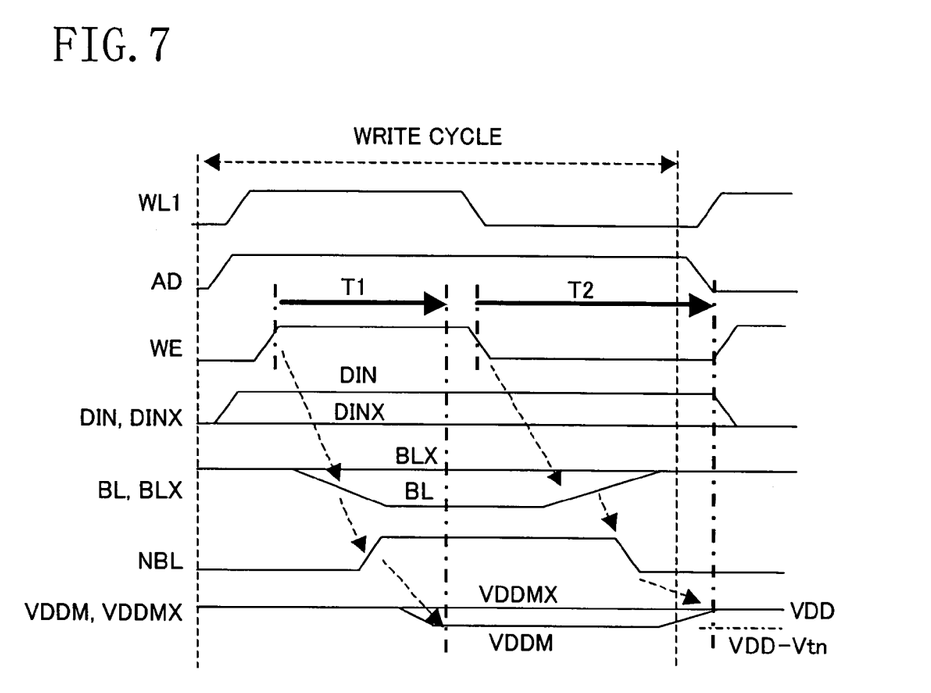
FIG. 7 is a timing diagram illustrating a write operation of the semiconductor memory of FIG. 6.

FIG. 7 is a timing diagram illustrating a write operation of the semiconductor memory of FIG. 6. In general, writing of data in an SRAM memory cell as shown in FIG. 6 is achieved by decreasing the potential of one of the bit lines BL and BLX, which has been precharged to a high potential ("H"), from "H" to a low potential ("L") while maintaining the word line WL at "H".

Before the start of a write cycle, the bit lines BL and BLX are precharged to supply potential VDD by a precharge circuit (not shown). Outputs NBL and NBLX of the inverters 973 and 974 are "L". The PMOS transistors 931 and 932 are conducting. The potentials of the high-data retaining supply lines VDDM and VDDMX are supply potential VDD.

After the start of the write cycle, the word line WL1 or WL2 is first selected. If the word line WL1 is selected, the potential of the word line WL1 transitions from "L" to "H" so that the access transistors 93 and 94 of the memory cell 80 connected to the word line WL1 become conducting. Meanwhile, address signal AD transitions to "H", and any of input data signals DIN and DINX transitions to "H". It should be noted that FIG. 7 shows an example where input data signal DIN transitions to "H".

Then, write control signal WE transitions to "H" so that the outputs of the AND circuits 951 and 953 of the selection circuit 950 become "H". As a result, the NMOS transistor 971 becomes conducting so that the bit line BL is discharged from supply potential VDD to the ground potential. Meanwhile, the potential of the bit line BLX stays at the precharged potential, i.e., supply potential VDD. When the potential of the bit line BL reaches the threshold of the inverter 973, output NBL of the inverter 973 transitions to "H" so that the PMOS transistor 931 becomes non-conducting while the NMOS transistor 933 becomes conducting.

As a result, the potential of the high-data retaining supply line VDDM transitions from supply potential VDD supplied by the PMOS transistor 931 to potential VDD-$V_{tn}$ supplied by the NMOS transistor 933 (where $V_{tn}$ represents the threshold of the NMOS transistor 933). The potential of the high-data retaining supply line VDDMX on the opposite side stays at supply potential VDD.

Since the potential of the high-data retaining supply line VDDM transitions to a lower level than the potential of the high-data retaining supply line VDDMX, the ability of the inverter 86 of outputting a current decreases. Therefore, even when the potential retained at the output node of the inverter 86 is "H", writing of "L" in this node through the bit line BL becomes easier. The ability of the inverter 87 of outputting a current is maintained, and thus, inversion of memory data is assisted in the operation of writing "L" through the bit line BL.

However, the semiconductor memory of FIG. 6 disadvantageously requires a long time for writing of data in a memory cell as described below.

In the semiconductor memory of FIG. 6, as illustrated in FIG. 7, after write control signal WE transitions to "H", the bit line BL transitions to "L" so that output NBL of the inverter 973 transitions to "H". Accordingly, the NMOS transistor 933 decreases the level of the high-data retaining supply line VDDM. After the bit line BL having a large wire capacitance is driven, the high-data retaining supply line VDDM is driven according to the potential of the bit line BL. Therefore, period T1 which extends between settling of write control signal WE and settling of the potential of the high-data retaining supply line VDDM at a lower level than supply potential VDD is long. Even after the potential of the bit line BL is settled, write control signal WE and the word line WL1 need to be maintained at "H" till the potential of the high-data retaining supply line VDDM is settled and writing of data in the memory cell completes. Thus, as a result, the time required for writing is long.

In the semiconductor memory of FIG. 6, after writing of data in the memory cell is completed, it disadvantageously takes a long time for the decreased potential of the high-data retaining supply line to return to supply potential VDD as described below.

In the semiconductor memory of FIG. 6, as illustrated in FIG. 7, write control signal WE transitions to "L" after writing is completed so that the NMOS transistor 971 becomes non-conducting, and the precharge circuit causes the bit line BL to transition to supply potential VDD. Accordingly, output NBL of the inverter 973 transitions to "L" so that the NMOS transistor 933 becomes non-conducting while the PMOS transistor 931 becomes conducting. As a result, the high-data retaining supply line VDDM returns to supply potential VDD. Since the high-data retaining supply line VDDM is driven according to the potential of the bit line BL, period T2 which extends between transition of write control signal WE to "L" and return of the high-data retaining supply line VDDM to supply potential VDD is long. Thus, the cycle time for writing is also long.

SUMMARY OF THE INVENTION

An objective of the present invention is to provide a semiconductor memory which has flip-flop type memory cells wherein writing of data in memory cells is easier and the cycle time is reduced.

A semiconductor memory according to the present invention includes memory cells, each of which includes two inverters cross-coupled such that the input and output of one inverter are connected to the output and input of the other, respectively, and two supply lines for supplying currents to the two inverters. The two supply lines are each driven according to a signal indicative of data which is to be written in the memory cell. Driving of the two supply lines is controlled without the intervention of a bit line.

More specifically, a semiconductor memory of the present invention includes: a plurality of memory cells arranged in a matrix of rows and columns; a plurality of word lines corresponding to the rows of memory cells, each of the word lines being connected to memory cells of a corresponding one of the rows; a plurality of bit line pairs corresponding to the columns of memory cells, each of the bit line pairs being connected to memory cells of a corresponding one of the columns; a plurality of high-data retaining supply line pairs corresponding to the columns of memory cells; a plurality of write circuits each of which drives a corresponding one of bit lines of the plurality of bit line pairs; and a plurality of high-data retaining supply circuits each connected to a corresponding one of high-data retaining supply lines of the plurality of high-data retaining supply line pairs. Each of the plurality of memory cells include: a first inverter connected to one of high-data retaining supply lines which constitute one of the high-data retaining supply line pairs corresponding to the memory cell; a second inverter connected to the other one of the high-data retaining supply lines which constitute the corresponding high-data retaining supply line pair, an input and output of the second inverter being connected to an output and input of the first inverter, respectively; a first access transistor connected between one of bit lines which constitute one of the bit line pairs corresponding to the memory cell and the output of the first inverter and connected to one of the word lines corresponding to the memory cell; and a second access transistor connected between the other one of the bit lines which constitute the corresponding bit line pair and the output of the second inverter and connected to the word line to which the first access transistor is connected. A selected one of the high-data retaining supply circuits receives a signal determined according to an input data signal and address signal without the intervention of any of the bit lines which constitute the bit line pairs to drive one of the high-data retaining supply lines connected to the selected high-data retaining supply circuit such that the driven high-data retaining supply line has a potential corresponding to the received signal.

With the above features, it is possible to provide an appropriate potential to a high-data retaining supply line pair, so that writing in a memory cell becomes easy. Therefore, high speed writing is stably performed even when the supply voltage is low. A high-data retaining supply circuit receives a signal determined according to an input data signal and address signal without the intervention of a bit line and drives a high-data retaining supply line connected to the high-data retaining supply circuit according to the received signal. Thus, high speed writing is possible.

According to the present invention, in a semiconductor memory having flip-flop type memory cells (e.g., SRAMs), writing becomes easy, and the cycle time is reduced. Therefore, a semiconductor memory which operates on a low supply voltage but which has a large write margin, which is capable of high speed operation, and which has stable memory cell characteristics, can be realized.

DESCRIPTION OF THE PREFERRED EMBODIMENTS

Hereinafter, embodiments of the present invention will be described with reference to the drawings.

Embodiment 1

Figure 1:
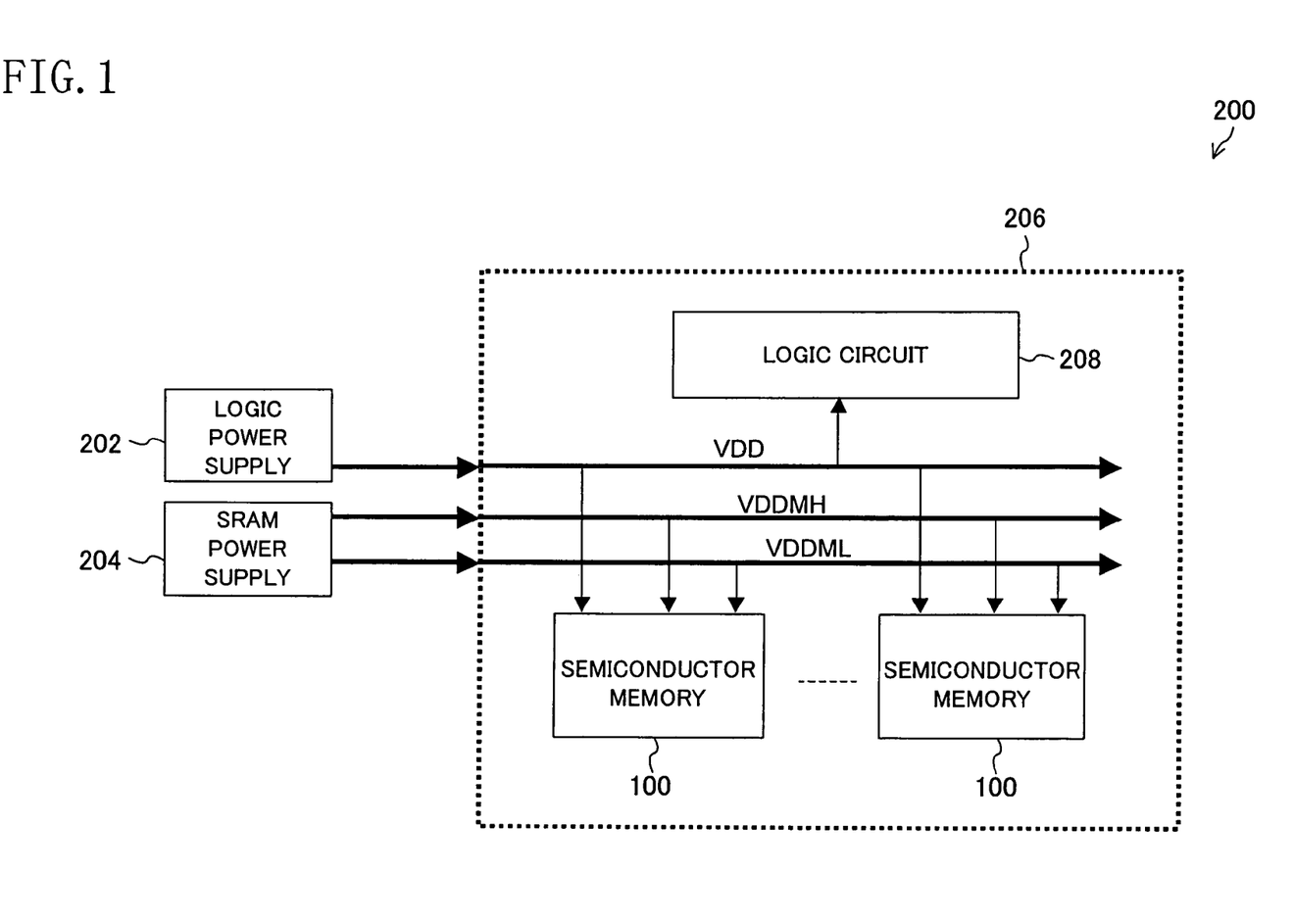
FIG. 1 is a block diagram showing a structure of a semiconductor circuit system which has a semiconductor memory according to embodiment 1 of the present invention.

FIG. 1 is a block diagram showing a structure of a semiconductor circuit system 200 which has a semiconductor memory according to embodiment 1 of the present invention. The semiconductor circuit system 200 includes a power supply for a logic circuit (logic power supply 202), a power supply for SRAM (SRAM power supply 204), and an LSI (large-scale integration) 206. The LSI 206 includes a plurality of semiconductor memories 100 and a logic circuit 208.

The logic power supply 202 generates supply potential VDD which is supplied to the plurality of semiconductor memories 100 and the logic circuit 208. The SRAM power supply 204 generates high-data retaining supply potentials VDDMH and VDDML for retaining high data in memory cells, which are supplied to the plurality of semiconductor memories 100. High-data retaining supply potential VDDMH is higher than supply potential VDD. High-data retaining supply potential VDDML is lower than supply potential VDD.

Figure 2:
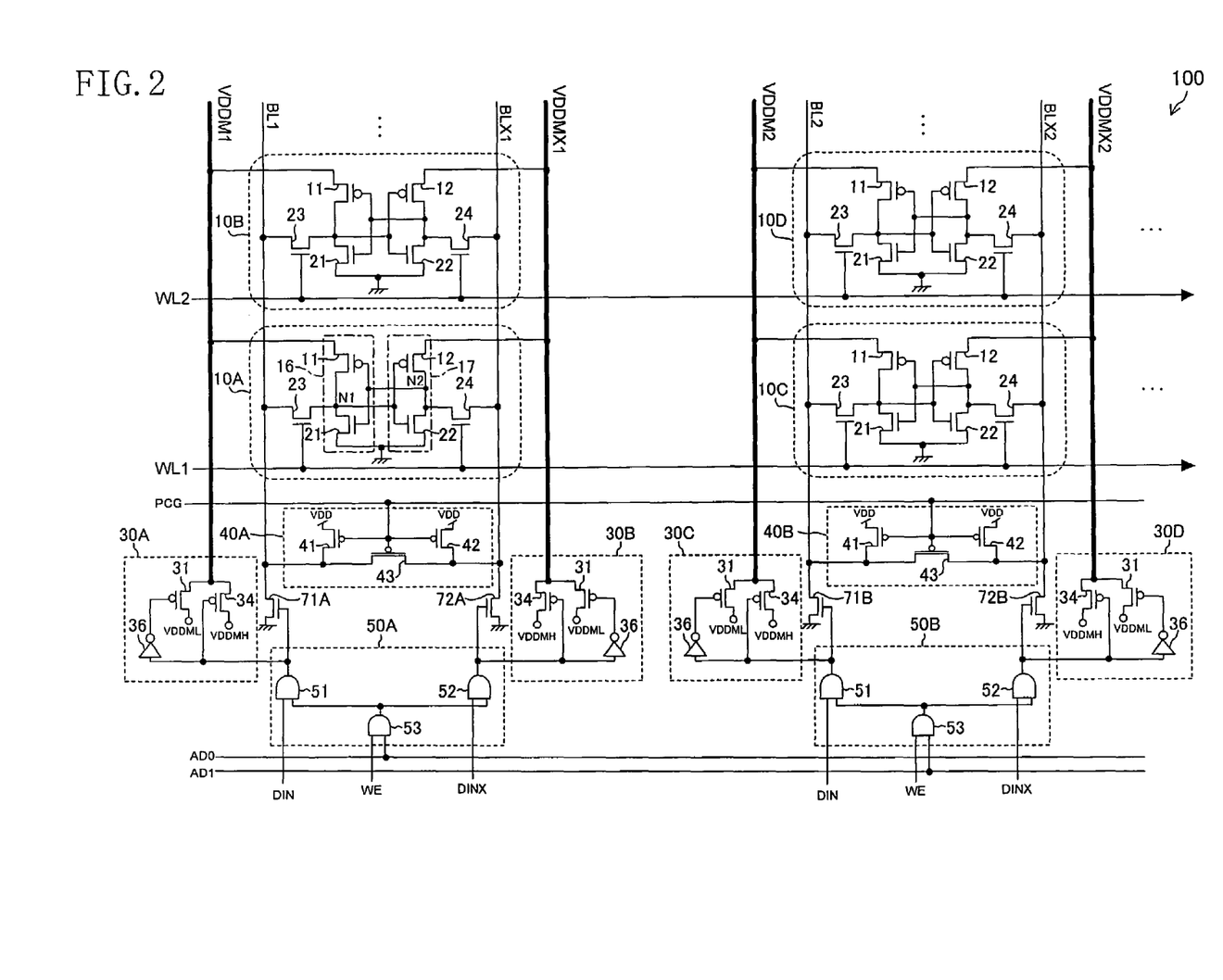
FIG. 2 is a circuit diagram showing a structure of a semiconductor memory according to embodiment 1 of the present invention.

FIG. 2 is a circuit diagram showing a structure of a semiconductor memory 100 according to embodiment 1 of the present invention. The semiconductor memory 100 includes memory cells (10A, 10B, 10C, 10D, . . . ), word lines WL1 and WL2, first bit lines BL1 and BL2, second bit lines BLX1 and BLX2, first high-data retaining supply lines VDDM1 and VDDM2, second high-data retaining supply lines VDDMX1 and VDDMX2, high-data retaining supply circuits 30A, 30B, 30C and 30D respectively connected to the high-data retaining supply lines VDDM1, VDDMX1, VDDM2 and VDDMX2, bit line precharge circuits 40A and 40B corresponding to the columns of memory cells 10A to 10D, selection circuits 50A and 50B corresponding to the columns of memory cells 10A to 10D, NMOS (n-channel metal oxide semiconductor) transistors 71A and 71B (write circuits) respectively connected to the bit lines BL1 and BL2, and NMOS transistors 72A and 72B (write circuits) respectively connected to the bit lines BLX1 and BLX2.

The semiconductor memory 100 includes rows and columns of memory cells having the same structure which are shown as being aligned vertically and horizontally in FIG. 2. For simple illustration, circuitry for reading is not shown in FIG. 2.

As illustrated in FIG. 2, the plurality of memory cells (10A, 10B, . . . ) are arranged in a matrix of rows and columns. The word lines WL1 and WL2 extend in the row direction and correspond to the rows of the memory cells (10A, 10B, . . . ). The word lines WL1 and WL2 are connected to memory cells of the corresponding rows of the memory cells (10A, 10B, . . . ). At the time of selection, supply potential VDD is applied to the word lines WL1 and WL2. At the time of non-selection, the ground potential is applied to the word lines WL1 and WL2.

The bit lines BL1 and BL2 extend in the column direction and correspond to the columns of the memory cells (1A, 10B, . . . ). The bit lines BL1 and BL2 are connected to memory cells of the corresponding columns of the memory cells (10A, 10B, . . . ). The bit lines BLX1 and BLX2 correspond to the bit lines BL1 and BL2, respectively. The bit lines BL1 and BLX1 constitute a bit line pair and are connected to memory cells of a column. The bit lines BL2 and BLX2 constitute another bit line pair and are connected to memory cells of another column.

The high-data retaining supply lines VDDM1 and VDDM2 extend in the column direction and correspond to the columns of the memory cells (10A, 10B, . . . ). The high-data retaining supply lines VDDM1 and VDDM2 are connected to memory cells of the corresponding columns of the memory cells (10A, 10B, . . . ). The high-data retaining supply lines VDDMX1 and VDDMX2 correspond to the high-data retaining supply lines VDDM1 and VDDM2, respectively. The high-data retaining supply lines VDDM1 and VDDMX1 constitute a high-data retaining supply line pair and are connected to memory cells of a column. The high-data retaining supply lines VDDM2 and VDDMX2 constitute a high-data retaining supply line pair and are connected to memory cells of another column.

Precharge control signal PCG is applied to the bit line precharge circuits 40A and 40B of each column. When all the word lines are inactive (low logic level: hereinafter, referred to as "L"), precharge control signal PCG is "L". When any of the word lines is active (high logic level: hereinafter, referred to as "H"), precharge control signal PCG is Column address signals AD0 and AD1, input data signals DIN and DINX, and write control signal (write enable signal) WE are supplied to the selection circuits 50A and 50B of each column. Input data signals DIN and DINX are complementary to each other.

The memory cells (10A, 10B, . . . ) are arranged in a matrix such that the memory cells correspond to the intersections of word lines and bit line pairs on a one-to-one basis. It should be noted that in FIG. 2 only the memory cells of two rows by two columns are shown for simplicity, the semiconductor memory 100 may include more columns and rows of memory cells. All the memory cells (10A, 10B, . . . ) have an identical structure, and all the columns have an identical structure except for the elements relevant to column addresses. Thus, the descriptions presented below are mainly focused on the memory cell 10A.

The memory cell 10A includes load transistors 11 and 12 realized by PMOS (p-channel metal oxide semiconductor) transistors, drive transistors 21 and 22 realized by NMOS transistors, and access transistors 23 and 24 realized by NMOS transistors.

In the memory cell 10A, the load transistor 11 and the drive transistor 21 constitute an inverter 16, and the load transistor 12 and the drive transistor 22 constitute an inverter 17. The input terminal of the inverter 16 and the output terminal of the inverter 17 are coupled together. The output terminal of the inverter 16 and the input terminal of the inverter 17 are coupled together. Namely, the inputs and outputs of the inverters 16 and 17 are cross coupled with each other to constitute a flip-flop.

The above configuration enables these two inverters 16 and 17 to retain at the output terminals the high data and low data (one represents "data 0" while the other represents "data 1"). The output terminals of the inverter 16 and inverter 17 are referred to as "data memory node N1" and "data memory node N2", respectively.

The gate terminals of the access transistors 23 and 24 are connected to the same word line, i.e., the word line WL1. The drain terminals of the access transistors 23 and 24 are connected to the bit lines BL1 and BLX1, respectively. The source terminals of the access transistors 23 and 24 are connected to the output terminals of the inverters 16 and 17, respectively.

The source terminals of the drive transistors 21 and 22 are connected to the ground potential. Namely, the low-data retaining supply potential for retaining low data in memory cells is equal to the ground potential. The source terminals of the load transistors 11 and 12 are connected to the high-data retaining supply lines VDDM1 and VDDMX1, through which a current is supplied to the load transistors 11 and 12.

The high-data retaining supply circuit 30A includes PMOS transistors 31 and 34 and an inverter 36. When the high-data retaining supply circuit 30A is in unselected state (input to the inverter 36 is "L"), the PMOS transistor 34 is conducting. The high-data retaining supply circuit 30A supplies high-data retaining supply potential VDDMH to the high-data retaining supply line VDDM1. When the high-data retaining supply circuit 30A is in selected state (input to the inverter 36 is "H"), the PMOS transistor 31 is conducting so that the high-data retaining supply circuit 30A supplies high-data retaining supply potential VDDML to the high-data retaining supply line VDDM1. The high-data retaining supply circuits 30B, 30C and 30D have the same structure as the high-data retaining supply circuit 30A to supply potentials to the corresponding high-data retaining supply lines VDDMX1, VDDM2 and VDDMX2, respectively.

High-data retaining supply potential VDDMH is higher than high-data retaining supply potential VDDML. In this embodiment, for example, high-data retaining supply potential VDDMH is higher than supply potential VDD by 0.1 V, and high-data retaining supply potential VDDML is lower than supply potential VDD by 0.1 V.

The bit line precharge circuit 40A is located at a position corresponding to the intersection of a signal line which transmits precharge control signal PCG and a bit line pair. The bit line precharge circuit 40A includes precharge transistors 41 and 42 and an equalizing transistor 43. These transistors are PMOS transistors.

Precharge control signal PCG is input to the gate terminal of each transistor of the bit line precharge circuit 40A. Supply potential VDD is supplied to the source terminals of the precharge transistors 41 and 42. The drain terminals of the precharge transistors 41 and 42 are connected to the source terminal and drain terminal of the equalizing transistor 43, respectively. The drain terminals of the precharge transistors 41 and 42 are connected to the bit lines BL1 and BLX1, respectively.

When precharge control signal PCG is "L", the bit line precharge circuit 40A precharges the bit lines BL1 and BLX1 to supply potential VDD. When precharge control signal PCG is "H", all the precharge transistors 41 and 42 and the equalizing transistor 43 are OFF so that the bit line precharge circuit 40A does not affect the bit lines BL1 and BLX1 (i.e., the bit line precharge circuit 40A enters an high impedance state).

The selection circuits (50A, 50B, . . . ) are provided to the columns of the memory cell array on a one-to-one basis. Each of the selection circuits includes AND circuits 51, 52 and 53. In the selection circuit 50A, write control signal WE and column address signal AD0 are input to the AND circuit 53. Input data signals DIN and DINX are input to the AND circuits 51 and 52, respectively. Input data signals DIN and DINX represent data which are to be written in memory cells. When one of input data signals DIN and DINX is "H", the other is "L".

When the left column of FIG. 2 is selected, column address signal AD0 transitions to "H". When write control signal WE is "H", the AND circuit 53 outputs "H" so that the AND circuits 51 and 52 outputs input data signals DIN and DINX as they are.

For example, address signal AD0 and input data signal DIN are "H", the output of the AND circuit 51 is "H" so that the bit line BL1 and the high-data retaining supply circuit 30A are selected. At this point in time, the transistor 71A becomes conducting according to the output of the AND circuit 51 so that the potential of the bit line BL1 transitions from supply potential VDD (precharged potential) to the ground potential. The potential of the other, unselected bit lines are maintained at supply potential VDD. The PMOS transistor 31 of the high-data retaining supply circuit 30A becomes conducting according to the output of the AND circuit 51. Therefore, the potential of the high-data retaining supply line VDDM1 transitions from high-data retaining supply potential VDDMH to high-data retaining supply potential VDDML.

Likewise, the high-data retaining supply circuits 30B, 30C and 30D drive the high-data retaining supply lines VDDMX1, VDDM2 and VDDMX2, respectively, according to the outputs of the AND circuit 52 of the corresponding selection circuit 50A and the AND circuits 51 and 52 of the corresponding selection circuit 50B.

Figure 3:
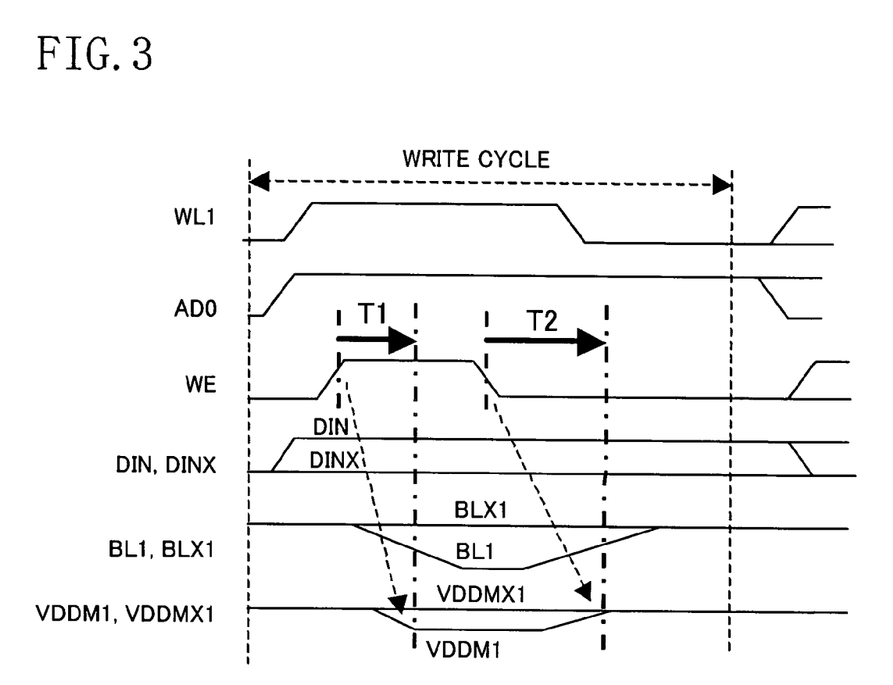
FIG. 3 is a timing diagram illustrating a write operation of the semiconductor memory of FIG. 2.

FIG. 3 is a timing diagram illustrating a write operation of the semiconductor memory of FIG. 2. The write operation of the semiconductor memory 100 of FIG. 2 is described with reference to FIG. 3. Before the write operation, if none of the memory cells is selected, precharge control signal PCG is "L". In this case, the bit line precharge circuits 40A and 40B precharge the bit lines BL1, BLX1, BL2 and BLX2 to supply potential VDD. The potentials of the word lines WL1 and WL2 are equal to the ground potential. The access transistors 23 and 24 of each of the memory cells (10A, 10B, . . . ) are non-conducting.

Address signals AD0 and AD1, write control signal WE, and input data signals DIN and DINX are "L" so that the high-data retaining supply circuits 30A to 30D supply high-data retaining supply potential VDDMH to the high-data retaining supply lines VDDM1, VDDMX1, VDDM2 and VDDMX2, respectively.

When the write operation is started, the potential of a selected one of the word lines WL1 and WL2 transitions from "L" to "H" so that the access transistors 23 and 24 of memory cells connected to the selected word line (e.g., the memory cells 10A and 10C) become conducting.

Meanwhile, one of address signals AD0 and AD1 corresponding to a selected column and any one of input data signals DIN and DINX transition from "L" to "H". In the example illustrated in FIG. 3, address signal AD0 and input data signal DIN transition to "H".

Then, write control signal WE transitions to "H" so that the output of the AND circuit 51 or 52 of the selection circuit 50A or 50B becomes "H". As a result, any of the transistors 71A, 72A, 71B and 72B of the selected column becomes conducting, whereby a bit line connected to the conducting transistor (any one of the bit lines BL1, BL2, BLX1 and BLX2) is selected. The potential of the selected bit line transitions from supply potential VDD to the ground potential.

Meanwhile, one of the high-data retaining supply circuits 30A to 30D corresponding to the selected bit line causes a high-data retaining supply line connected to this circuit (any one of the high-data retaining supply lines VDDM1, VDDM2, VDDMX1 and VDDMX2) to transition from high-data retaining supply potential VDDMH to high-data retaining supply potential VDDML. Transition of the potentials of the bit lines BL1, BL2, BLX1 and BLX2 to "L" occurs in parallel with transition of the potentials of the corresponding high-data retaining supply lines to high-data retaining supply potential VDDML.

For example, the word line WL1 is selected while address signal AD0 and input data signal DIN are selected (potentials transition to "H"). In this case, the bit line BL1 is selected, and the potential of the bit line BL1, i.e., the ground potential, i.e., "L", is written in the data memory node N1 of the memory cell 10A which includes the access transistor 23 via the access transistor 23 connected to the word line WL1 and the bit line BL1.

If data "H" had been previously written in this data memory node N1, the load transistor 11 and the drive transistor 22, which are components of the flip-flop constituting the memory cell 10A, would have become conducting, so that the level of the data memory node N1 connected to the access transistor 23 would have been maintained at "H".

To achieve writing, the potential of the data memory node N1 needs to be inverted. As described above, when the bit line BL1 of FIG. 2 is selected, the high-data retaining supply line VDDM1 adjacent to the bit line BL1 decreases to high-data retaining supply potential VDDML. Accordingly, the source potential of the load transistor 11 transitions to high-data retaining supply potential VDDML, so that the current drivability of the load transistor 11 decreases. Thus, a writing operation which causes the data memory node N1 to transition to "L" becomes easier. The high-data retaining supply line VDDMX1 on the opposite side of the same column stays as high as high-data retaining supply potential VDDMH, so that the current drivability of the load transistor 12 is maintained high.

Under the above-described conditions, the ground potential of the bit line BL1 is written, via the access transistor 23, in the data memory node N1 which is connected to the gate of the load transistor 12. In this case, the load transistor 12 having high current drivability enhances data inversion of the flip-flop. Thus, even when the supply voltage is low, writing of data can easily be achieved.

Meanwhile, the high-data retaining supply lines VDDM2 and VDDMX2 provided to the memory cells 10C and 10D of the unselected column are maintained at high-data retaining supply potential VDDMH which is higher than potential VDD of the word line WL1. Even when the access transistor 23 or 24 of the memory cell 10C of the unselected column is rendered conducting by the word line WL1, the potentials of the high-data retaining supply lines VDDM2 and VDDMX2 of the memory cell 10C are higher than potential VDD of the selected word line WL1. Therefore, the memory cell 10C has high resistance to noise of the bit lines BL2 and BLX2 as compared with a case where the potentials of the high-data retaining supply lines VDDM2 and VDDMX2 are equal to potential VDD of the selected word line WL1.

In the semiconductor memory 100 of FIG. 2, the output of the selection circuit 50A or 50B, which is obtained according to the input data signal, is directly supplied to the high-data retaining supply circuits 30A to 30D without passing through any other element, such as the bit line BL1, or the like. For example, it is not necessary to wait for a change in potential of the bit line BL1, and therefore, the high-data retaining supply line VDDM1 and the bit line BL1 are driven at substantially the same time.

Namely, as illustrated in FIG. 3, period T1 which extends between transition of write control signal WE to "H" and settling of the potential of the high-data retaining supply line VDDM1 at a lower level than supply potential VDD can be shortened. Thus, the cycle time for writing can be shortened. Further, as illustrated in FIG. 3, period T2 which extends between transition of write control signal WE to "L" after completion of writing and return of the high-data retaining supply line VDDM1 to high-data retaining supply potential VDDMH can be shortened likewise. Thus, the cycle time can be shortened.

Next, a read operation of the semiconductor memory 100 of FIG. 2 is described. The levels of the input signals in the read operation are the same as those in the write operation except that write control signal WE is maintained at "L" which represents that writing is not performed.

Since write control signal WE is "L", none of the transistors 71A, 72A, 71B and 72B and the high-data retaining supply circuits 30A to 30D is selected, and none of the bit lines BL1, BL2, BLX1 and BLX2 is driven to the ground potential. When any of the word lines WL1 and WL2 is selected, the memory cells connected to the selected word line are selected. Memory data of the selected memory cells are read out to the bit lines BL1, BL2, BLX1 and BLX2. A read circuit (not shown) amplifies the memory data and outputs the amplified data to external devices.

In the read operation, none of the high-data retaining supply circuits 30A to 30D is selected, and therefore, the potentials of the high-data retaining supply lines VDDM1, VDDM2, VDDMX1 and VDDMX2 are maintained at high-data retaining supply potential VDDMH which is higher than the potential of the word line, i.e., potential VDD. Thus, the margin for noise of the memory cells selected by the word line is maintained high.

As described above, in the semiconductor memory 100 according to this embodiment, the high-data retaining supply circuits for supplying power to the two inverters of each memory cell are independent such that different potentials which are determined according to an input data signal to be written are applied as high-data retaining supply potentials to the two inverters of a memory cell selected for writing. Therefore, even when the supply voltage is low, writing is achieved easily and quickly.

In the write operation, the potentials of the high-data retaining supply lines are changed according to the input data signal in parallel with driving of bit lines having large wire capacitance such that writing is easily achieved. Thus, the cycle time of the write operation is reduced, and hence, the operation speed of the system is increased.

In the write operation, the high-data retaining supply potential of the memory cells of an unselected column is maintained higher than the level of the selected word line. Thus, the margin for noise of the memory cells connected to the selected word line is maintained high.

In the read operation, the high-data retaining supply potentials of all the memory cells are maintained higher than the level of the selected word line. Thus, the margin for noise of the memory cells connected to the selected word line is maintained high.

Embodiment 2

Figure 4:
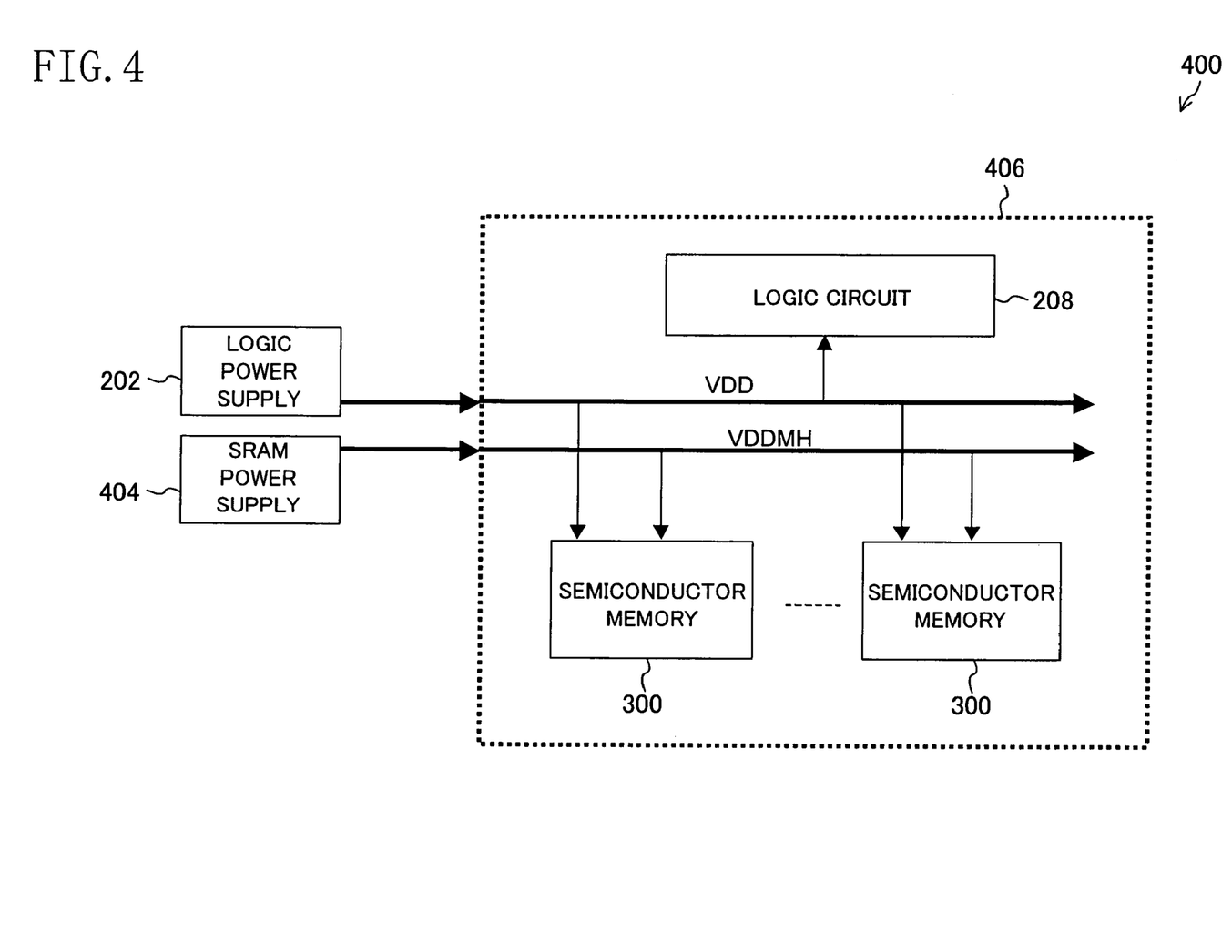
FIG. 4 is a block diagram showing a structure of a semiconductor circuit system which has a semiconductor memory according to embodiment 2 of the present invention.

FIG. 4 is a block diagram showing a structure of a semiconductor circuit system 400 which has a semiconductor memory according to embodiment 2 of the present invention. The semiconductor circuit system 400 includes a power supply for a logic circuit (logic power supply 202), a power supply for SRAM (SRAM power supply 404), and an LSI 406. The LSI 406 includes a plurality of semiconductor memories 300 and a logic circuit 208.

The logic power supply 202 generates supply potential VDD which is supplied to the plurality of semiconductor memories 300 and the logic circuit 208. The SRAM power supply 404 generates high-data retaining supply potential VDDMH which is supplied to the plurality of semiconductor memories 300. High-data retaining supply potential VDDMH is higher than supply potential VDD.

Figure 5:
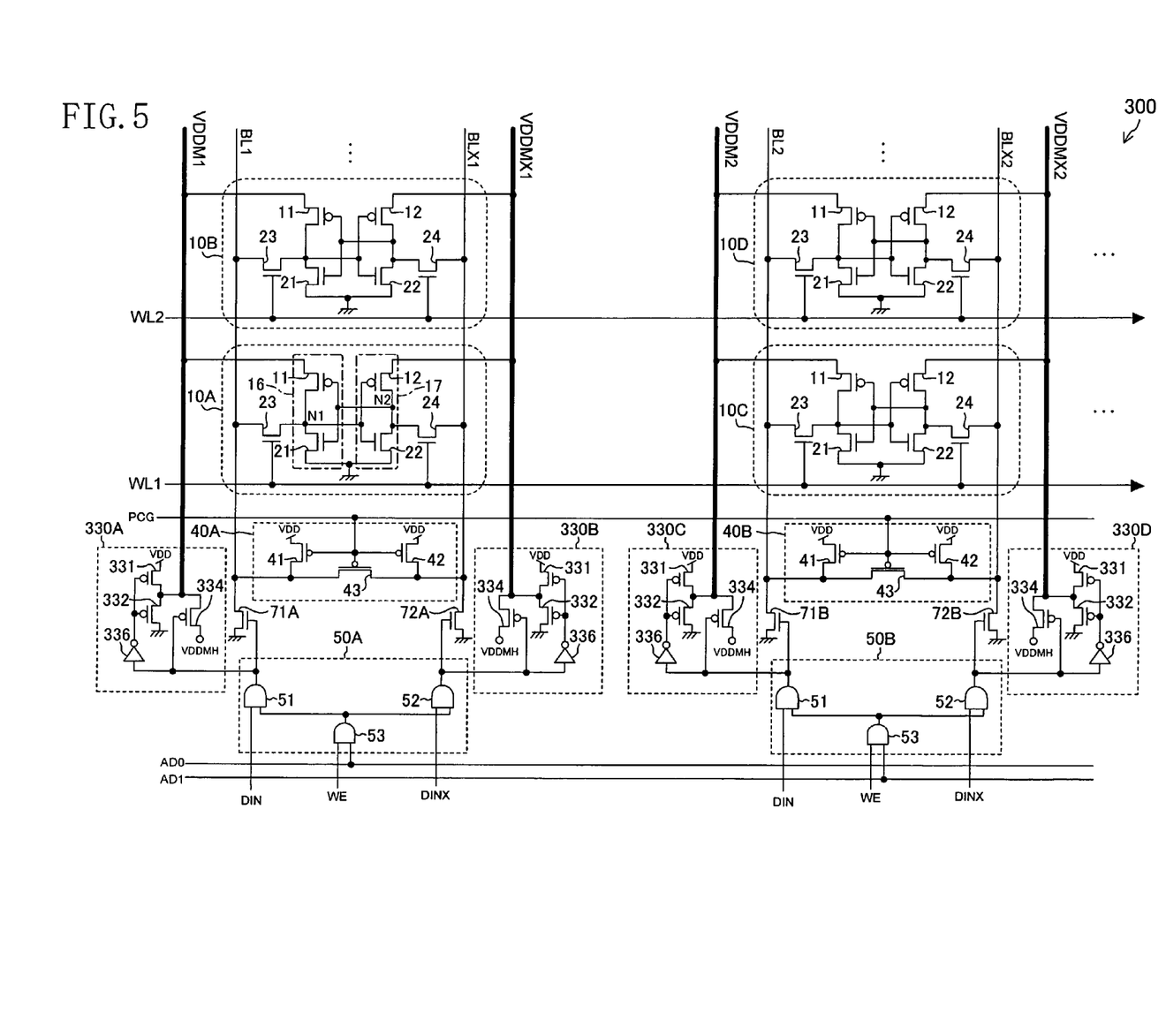
FIG. 5 is a circuit diagram showing a structure of a semiconductor memory according to embodiment 2 of the present invention.

FIG. 5 is a circuit diagram showing a structure of a semiconductor memory 300 according to embodiment 2 of the present invention. The semiconductor memory 300 has substantially the same structure as the semiconductor memory 100 of FIG. 2 except that the semiconductor memory 300 includes high-data retaining supply circuits 330A, 330B, 330C and 330D in place of the high-data retaining supply circuits 30A, 30B, 30C and 30D, respectively, and therefore, the descriptions of the other elements are herein omitted.

The high-data retaining supply circuit 330A includes PMOS transistors 331, 332 and 334 and an inverter 336. The PMOS transistors 331 and 332 are connected in series between supply potential VDD (potential of a selected word line) and the ground potential. An intermediate node of a circuit formed by the serially-connected PMOS transistors 331 and 332 is connected to the high-data retaining supply line VDDM1.

When the high-data retaining supply circuit 330A is in unselected state (input to the inverter 336 is "L"), the PMOS transistor 334 is conducting, so that the high-data retaining supply circuit 330A supplies, to the high-data retaining supply line VDDM1, high-data retaining supply potential VDDMH which is higher than supply potential VDD. When the high-data retaining supply circuit 330A is in selected state (input to the inverter 336 is "H"), the PMOS transistors 331 and 332 are conducting. Under these circumstances, the high-data retaining supply circuit 330A decreases supply potential VDD and supplies to the high-data retaining supply line VDDM1 a potential lower than supply potential VDD (potential obtained by dividing supply potential VDD by the PMOS transistors 331 and 332) as high-data retaining supply potential VDDML.

The high-data retaining supply circuits 330B, 330C and 330D have the same structure as the high-data retaining supply circuit 330A to drive the corresponding high-data retaining supply lines VDDMX1, VDDM2 and VDDMX2, respectively.

The operation timing of the semiconductor memory 300 of FIG. 5 is the same as that illustrated in FIG. 3, and therefore, the descriptions thereof are herein omitted.

As described above, according to this embodiment, the semiconductor memory 300 of FIG. 5 generates high-data retaining supply potential VDDML, which is used for writing, inside the semiconductor memory 300. Thus, as illustrated in FIG. 4, the SRAM power supply 404 only needs to generate high-data retaining supply potential VDDMH. Namely, the number of types of potentials generated by the SRAM power supply 404 is reduced. Therefore, the SRAM power supply 404 is more readily realized at reduced cost. Further, the number of supply lines over the LSI 406 is reduced.

The high-data retaining supply circuits 330A to 330D have a plurality of MOS transistors connected in series between supply potential VDD which is the potential of the selected word line and the ground potential to generate high-data retaining supply potential VDDML. Therefore, the high-data retaining supply circuits 330A to 330D easily generate a lower potential than the potential of the selected word line only when selected. Further, high-data retaining supply potential VDDML can readily be adjusted by adjusting the size of these MOS transistors.

In the high-data retaining supply circuits 330A to 330D, a resistor may be used in substitution for the PMOS transistor 331. Alternatively, NMOS transistors may be used in substitution for the PMOS transistors 331 and 332 while the inverter 336 is not used.

Alternatively, the high-data retaining supply circuits 330A to 330D may increase the level of supply potential VDD to generate high-data retaining supply potential VDDMH. In this case, the SRAM power supply 404 is not necessary.

Although in the above-described examples of the embodiments the high-data retaining supply lines (VDDM1, VDDMX1, . . . ) are arranged to extend in the column direction, the high-data retaining supply lines may be arranged to extend in the row direction such that each row of the memory cells (10A, 10B, . . . ) corresponds to a pair of the high-data retaining supply lines.

As described above, the present invention enables increase in the operation speed with easier writing realized and improvement of static noise margin and is useful for a semiconductor memory which has flip-flop type memory cells.

What is claimed is:

1. A semiconductor memory, comprising:
   a plurality of memory cells arranged in a matrix of rows and columns;
   a plurality of word lines corresponding to the rows of memory cells, each of the word lines being connected to memory cells of a corresponding one of the rows;
   a plurality of bit line pairs corresponding to the columns of memory cells, each of the bit line pairs being connected to memory cells of a corresponding one of the columns;
   a plurality of high-data retaining supply line pairs corresponding to the columns of memory cells;
   a plurality of write circuits each of which drives a corresponding one of bit lines of the plurality of bit line pairs; and
   a plurality of high-data retaining supply circuits each connected to a corresponding one of high-data retaining supply lines of the plurality of high-data retaining supply line pairs,
   wherein each of the plurality of memory cells include
   a first inverter connected to one of high-data retaining supply lines which constitute one of the high-data retaining supply line pairs corresponding to the memory cell,
   a second inverter connected to the other one of the high-data retaining supply lines which constitute the corresponding high-data retaining supply line pair, an input and output of the second inverter being connected to an output and input of the first inverter, respectively,
   a first access transistor connected between one of bit lines which constitute one of the bit line pairs corresponding to the memory cell and the output of the first inverter and connected to one of the word lines corresponding to the memory cell, and
   a second access transistor connected between the other one of the bit lines which constitute the corresponding bit line pair and the output of the second inverter and connected to the word line to which the first access transistor is connected, and
   a selected one of the high-data retaining supply circuits receives a signal determined according to an input data signal and address signal without the intervention of any of the bit lines which constitute the bit line pairs to drive one of the high-data retaining supply lines connected to the selected high-data retaining supply circuit such that the driven high-data retaining supply line has a potential corresponding to the received signal.

2. The semiconductor memory of claim 1, wherein the selected high-data retaining supply circuit drives the high-data retaining supply line connected to the high-data retaining supply circuit such that the driven high-data retaining supply line has a high-data retaining supply potential which is lower than a potential of a word line corresponding to a memory cell in which writing is to be performed.

3. The semiconductor memory of claim 2, wherein the high-data retaining supply potential is supplied from the outside of the semiconductor memory.

4. The semiconductor memory of claim 2, wherein the selected high-data retaining supply circuit decreases the potential supplied from the outside of the semiconductor memory to generate the high-data retaining supply potential.

5. The semiconductor memory of claim 4, wherein:
   the selected high-data retaining supply circuit has a plurality of MOS transistors connected in series between a node having a potential equal to a potential of a word line corresponding to the memory cell in which writing is to be performed and a node having a potential equal to a ground potential; and
   the selected high-data retaining supply circuit outputs, as the high-data retaining supply potential, a potential of a node to which the MOS transistors are connected.

6. The semiconductor memory of claim 1, wherein a high-data retaining supply line connected to the selected high-data retaining supply circuit and a selected one of the bit lines which constitute the plurality of bit line pairs are driven substantially simultaneously.

7. The semiconductor memory of claim 1, wherein one of the high-data retaining supply line pairs which does not correspond to a memory cell in which writing is to be performed is controlled to have a potential higher than a potential of a word line corresponding to the memory cell in which writing is to be performed.

* * * * *